US012615021B1

(12) United States Patent
Forbes

(10) Patent No.: US 12,615,021 B1
(45) Date of Patent: Apr. 28, 2026

(54) HIGH SPEED RF SWITCH METHOD EMPLOYING DIFFERENTIAL CURRENT CANCELLATION

(71) Applicant: National Technology & Engineering Solutions of Sandia, LLC, Albuquerque, NM (US)

(72) Inventor: Travis Forbes, Overland Park, KS (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 513 days.

(21) Appl. No.: 18/133,584

(22) Filed: Apr. 12, 2023

(51) Int. Cl.
| | |
|---|---|
| *H03F 3/193* | (2006.01) |
| *H03F 1/22* | (2006.01) |
| *H03F 3/45* | (2006.01) |

(52) U.S. Cl.
CPC ............. *H03F 3/193* (2013.01); *H03F 1/223* (2013.01); *H03F 3/45183* (2013.01); *H03F 2200/451* (2013.01)

(58) Field of Classification Search
CPC ................. H03F 3/193; H03F 3/45183; H03F 2200/451; H03F 1/223
USPC ................................................. 330/252–261
See application file for complete search history.

(56) References Cited

U.S. PATENT DOCUMENTS

| | | | | | |
|---|---|---|---|---|---|
| 7,095,281 | B2 * | 8/2006 | Zipper | ................ | H03F 3/45654 330/261 |
| 7,605,655 | B2 * | 10/2009 | Kim | .................... | H03F 3/45188 330/252 |
| 11,791,784 | B2 * | 10/2023 | Lien | .................... | H03F 3/45475 330/253 |
| 2006/0057980 | A1 * | 3/2006 | Haque | ........................ | H03F 3/24 455/127.1 |
| 2010/0182089 | A1 * | 7/2010 | Zolfaghari | .............. | H03F 3/195 330/253 |
| 2013/0147557 | A1 * | 6/2013 | Chiu | .................... | H03G 1/0029 330/254 |
| 2019/0149102 | A1 * | 5/2019 | Altunkilic | ............... | H03F 3/245 330/277 |
| 2024/0063765 | A1 * | 2/2024 | Sedighi | ............... | H03F 3/45475 |

OTHER PUBLICATIONS

Hill, C. et al., "RF Watt-Level, Low-Insertion-Loss, High-Bandwidth SOI CMOS Switches," IEEE Transactions on Microwave Theory and Techniques (2018) 66:5724-5736.

(Continued)

*Primary Examiner* — Andrea Lindgren Baltzell
*Assistant Examiner* — Nareh Shamiryan
(74) *Attorney, Agent, or Firm* — Mark A. Dodd

(57) ABSTRACT

A radio frequency (RF) switch employing differential signal cancellation is disclosed. The differential RF switch enables high isolation and extremely small size by employing cascode current steering within a differential switching amplifier. Unlike series RF switches, isolation with the differential RF switch is limited by device mismatch, not switch parasitic capacitance, enabling high frequency operation. Since the differential RF switch can be placed within the already present cascode devices, there is no additional insertion loss from the switch.

14 Claims, 4 Drawing Sheets

(56) References Cited

OTHER PUBLICATIONS

Hug, J. J. et al., "A 100 W, UHF to S-Band RF Switch in the Super-Lattice Castellated Field Effect Transistor (SLCFET) 3S Process, " 2020 IEEE Radio Frequency Integrated Circuits Symposium, pp. 71-74.

Kodak, U. et al., "A 5G 28-GHz Common-Leg T/R Front-End in 45-nm CMOS SOI With 3.7-dB NF and -30-dBc EVM With 64-QAM/500-MBaud Modulation," IEEE Transaction on Microwave Theory and Techniques (2019) 67 (1):318-331.

Parlak, M. et al., "A Passive I/Q Millimeter-Wave Mixer and Switch in 45-nm CMOS SOI," IEEE Transactions on Microwave Theory and Techniques (2013) 61(3):1131-1139.

* cited by examiner

100

200

HIGH SPEED RF SWITCH METHOD EMPLOYING DIFFERENTIAL CURRENT CANCELLATION

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a radio frequency (RF) switch enabling high isolation and minimal insertion loss through the use of differential current cancellation.

BACKGROUND

Radar systems targeting long distance operation, such as those used for weather radar, must receive and process RF reflections with good signal-to-noise ratio (SNR) from objects more than fifty miles away. Such radar systems employ high transmit power and highly directional antennas to maintain a good SNR but are sensitive to leakage between the transmit and receive paths through electromagnetic (EM) coupling inside the enclosed radar module and through power supplies. This leakage can create a high gain positive feedback loop between the transmit and receive paths, which can cause the circuits to oscillate, especially during high power transmit events. To prevent oscillation, RF switches are placed between amplifiers in both the transmit and receive paths where only one path is enabled at a time, and the disabled path should have no gain in order to prevent any positive loop gain from forming.

A similar approach is used in radar systems which employ off-chip high quality factor filters in the receiver which have a long impulse response time. In this case, isolation switches prevent large pulse injection into the filters during transmit events to enable fast pulsing operation. Series RF switches have shown good performance when employed at the antenna interface to switch the connection between the antenna and the transmitter/receiver. A conventional radar design employs the same RF switches between amplifiers for isolation. However, these series RF switches have significant insertion losses, which must be overcome by additional amplification and power consumption, have limited isolation, and are physically large in size.

Conventional series RF switches are constructed from a pass transistor ($M_1$) placed in the signal path, and a shunt transistor ($M_2$) placed at the pass transistor output to ground. In the ON state, $M_1$ is enabled while $M_2$ is disabled, with insertion loss set by the resistance of $M_1$ compared to the impedance seen looking into the next RF circuit block. In the OFF state, $M_1$ is disabled and $M_2$ is enabled, where $M_1$ provides a high signal path impedance and $M_2$ provides a small impedance at the output of $M_1$ to ground. While the disabled state resistance of $M_1$ is high, the drain-to-source capacitance $C_{ds}$ of $M_1$ forms a high pass filter with the enabled resistance of $M_2$, thus creating a high pass filter. This high pass filter results in reduced isolation with increased RF frequency.

Another challenge with placing a series RF switch between two amplifiers is perturbation of the DC operating point. In the conventional approach, a DC blocking capacitor is required prior to the series RF switch to keep the DC level at the switch node at 0V, since in the OFF state, the shorted transistor $M_2$ will force DC voltage to 0V. If the DC blocking capacitor is not included, the output node of the series RF switch that connects to the DC blocking capacitor at the next amplifier input would be required to charge back to the previous amplifier's output voltage when transitioning to the ON state prior to normal circuit operation, thereby limiting switching time.

Thus, the need exists for RF switches that provide high isolation, minimal insertion losses, and low switching times, all while occupying little space and consuming little power.

SUMMARY

One aspect of the present invention relates to a RF switch that employs differential current cancellation, in which currents of equal magnitude and the same or opposite phases are added when the RF switch is ON or OFF, respectively. When the RF switch is OFF, the currents of equal magnitude but opposite phase are added, thereby canceling each other, and providing improved isolation. By including additional calibrating cascode transistors, the current magnitudes can be more closely matched, thereby further improving cancellation, and thus isolation. A current source transistor may optionally be included to reject common mode signals. A constant DC bias point maintained between the ON and OFF states enables fast switching operation. The RF switch may be implemented in CMOS with other RF functionality, thereby reducing space requirements and power consumption.

In at least one embodiment of the invention, a differential switching amplifier comprises positive and negative inverting input transistors receiving corresponding positive and negative input voltages and converting the corresponding positive and negative input voltages into respective negative and positive input currents, positive and negative output terminals outputting corresponding positive and negative output currents, a pair of always on cascode transistors (each of the pair of always on cascode transistors having a width of W/2, a first of the pair of always on cascode transistors coupling half of the negative input current to the negative output terminal, a second of the pair of always on cascode transistors coupling half of the positive input current to the positive output terminal), a pair of enabled cascode transistors receiving an enable gate signal (EN) (each of the pair of enabled cascode transistors having a width of W/2, a first of the pair of enabled cascode transistors coupling half of the negative input current to the negative output terminal when EN is high and coupling no current to the negative output terminal when EN is low, a second of the pair of enabled cascode transistors coupling half of the positive input current to the positive output terminal when EN is high and coupling no current to the positive output terminal when EN is low), and a pair of bar enabled cascode transistors receiving a bar enable gate signal (ENB), wherein ENB is a logical opposite of EN (each of the pair of bar enabled cascode transistors having a width of W/2, a first of the pair of bar enabled cascode transistors coupling half of the negative input current to the positive output terminal when ENB is high and coupling no current to the positive output terminal when ENB is low, a second of the pair of bar enabled cascode transistors coupling half of the positive input current to the negative output terminal when ENB is high and coupling no current to the negative output terminal when ENB is low).

In various embodiments, the differential switching amplifier further comprises a current source device (the current source device coupled to corresponding sources of the positive and negative inverting input transistors, the current source device rejecting common mode signals); and the current source device is a transistor, an inductor, an LC tank circuit, or a resistor.

In other embodiments, the differential switching amplifier further comprises a pair of always off cascode transistors (each of the pair of always off cascode transistors having a width of W/2, a first of the pair of always off cascode transistors coupled between the positive inverting input transistor and the negative output terminal, a second of the pair of always off cascode transistors coupled between the negative inverting input transistor and the positive output terminal); and the differential switching amplifier further comprises a pair of calibrating cascode transistors (a first of the pair of calibrating cascode transistors coupled between the positive inverting input transistor and the negative output terminal, a second of the pair of calibrating cascode transistors coupled between the negative inverting input transistor and the positive output terminal, the pair of calibrating cascode transistors cancelling gain imbalance between the positive and negative output terminals).

In still other embodiments, the positive and negative input voltages correspond to a balanced input voltage; and the positive input voltage corresponds to an unbalanced input voltage and the negative input voltage corresponds to ground.

In at least one embodiment of the invention, an RF system comprises an antenna transmitting and receiving RF signals, a baseband and processing element processing baseband signals, and receive and transmit differential switching amplifiers (the receive differential switching amplifier receiving an RF signal from the antenna and outputting an amplified/switched signal to the baseband and processing element, the transmit differential switching amplifier receiving an RF signal from the baseband and processing element and outputting an amplified/switched signal to the antenna, each of the receive and transmit differential switching amplifiers includes positive and negative inverting input transistors receiving corresponding positive and negative input voltages corresponding to an RF signal and converting the corresponding positive and negative input voltages into respective negative and positive input currents), positive and negative output terminals outputting corresponding positive and negative output currents, a pair of always on cascode transistors (each of the pair of always on cascode transistors having a width of W/2, a first of the pair of always on cascode transistors coupling half of the negative input current to the negative output terminal, a second of the pair of always on cascode transistors coupling half of the positive input current to the positive output terminal), a pair of enabled cascode transistors receiving an enable gate signal (EN) (each of the pair of enabled cascode transistors having a width of W/2, a first of the pair of enabled cascode transistors coupling half of the negative input current to the negative output terminal when EN is high and coupling no current to the negative output terminal when EN is low, a second of the pair of enabled cascode transistors coupling half of the positive input current to the positive output terminal when EN is high and coupling no current to the positive output terminal when EN is low), and a pair of bar enabled cascode transistors receiving a bar enable gate signal (ENB), wherein ENB is a logical opposite of EN (each of the pair of bar enabled cascode transistors having a width of W/2, a first of the pair of bar enabled cascode transistors coupling half of the negative input current to the positive output terminal when ENB is high and coupling no current to the positive output terminal when ENB is low, a second of the pair of bar enabled cascode transistors coupling half of the positive input current to the negative output terminal when ENB is high and coupling no current to the negative output terminal when ENB is low).

In various embodiments, each of the receive and transmit differential switching amplifiers further includes a current source device (the current source device coupled to corresponding sources of the positive and negative inverting input transistors, the current source device rejecting common mode signals); and the current source device is a transistor, an inductor, an LC tank circuit, or a resistor.

In other embodiments, each of the receive and transmit differential switching amplifiers further includes a pair of always off cascode transistors (each of the pair of always off cascode transistors having a width of W/2, a first of the pair of always off cascode transistors coupled between the positive inverting input transistor and the negative output terminal, a second of the pair of always off cascode transistors coupled between the negative inverting input transistor and the positive output terminal); and each of the receive and transmit differential switching amplifiers further includes a pair of calibrating cascode transistors (a first of the pair of calibrating cascode transistors coupled between the positive inverting input transistor and the negative output terminal, a second of the pair of calibrating cascode transistors coupled between the negative inverting input transistor and the positive output terminal, the pair of calibrating cascode transistors cancelling gain imbalance between the positive and negative output terminals).

In still other embodiments, the positive and negative input voltages correspond to a balanced input RF signal; and the positive input voltage corresponds to an unbalanced input RF signal and the negative input voltage corresponds to ground.

In yet other embodiments, the RF system further comprises second receive and transmit differential switching amplifiers (the second receive differential switching amplifier receiving the amplified/switched signal from the receive differential switching amplifier and outputting a further amplified/switched signal to the baseband and processing element, the second transmit differential switching amplifier receiving the amplified/switched signal from the transmit differential switching amplifier and outputting a further amplified/switched signal to the antenna; and each of the second receive and transmit differential switching amplifiers comprises second positive and negative inverting input transistors receiving corresponding second positive and negative input voltages corresponding to an RF signal and converting the corresponding second positive and negative input voltages into respective second negative and positive input currents, second positive and negative output terminals outputting corresponding second positive and negative output currents, a second pair of always on cascode transistors (each of the second pair of always on cascode transistors having a width of W/2, a first of the second pair of always on cascode transistors coupling half of the second negative input current to the second negative output terminal, a second of the second pair of always on cascode transistors coupling half of the second positive input current to the second positive output terminal), a second pair of enabled cascode transistors receiving a second enable gate signal (EN) (each of the second pair of enabled cascode transistors having a width of W/2, a first of the second pair of enabled cascode transistors coupling half of the second negative input current to the second negative output terminal when the second EN is high and coupling no current to the second negative output terminal when the second EN is low, a second of the second pair of enabled cascode transistors coupling half of the second positive input current to the second positive output terminal when the second EN is high and coupling no current to the second positive output terminal when the second EN is low), and a second pair of bar enabled cascode transistors receiving a second bar enable gate signal (ENB), the second ENB being a logical opposite of the second EN (each of the second pair of bar enabled cascode transistors having a width of W/2, a first of the second pair of bar enabled cascode transistors coupling half of the second negative input current to the second positive output terminal when the second ENB is high and coupling no current to the second positive output terminal when the second ENB is low, a second of the second pair of bar enabled cascode transistors coupling half of the second positive input current to the second negative output terminal when the second ENB is high and coupling no current to the second negative output terminal when the second ENB is low).

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

Figure 1:
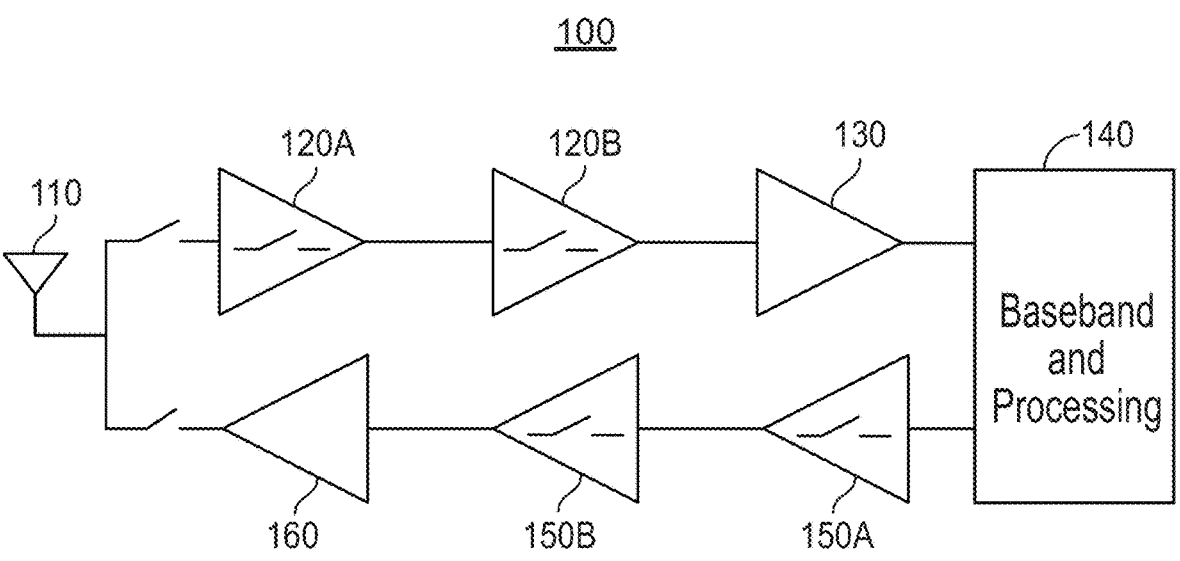
FIG. 1 illustrates an RF system design employing a differential switching amplifier in accordance with one or more embodiments of the present invention.

In at least one embodiment of the present invention, the RF isolation switch operation is integrated into the amplifier design, as illustrated in the RF system 100 of FIG. 1. The RF system 100 includes a bidirectional antenna 110 for transmitting and receiving RF signals. The received RF signal is amplified by one or more differential switching amplifiers 120A, 120B, along with a traditional amplifier 130, before being feed to a baseband and processing element 140. An RF signal generated by the baseband and processing element 140 is amplified by one or more differential switching amplifiers 150A, 150B, along with a traditional amplifier 160, before being feed to the antenna 110 for transmission. This embodiment of the RF switching approach employs current steering in the differential switching amplifier cascode devices to cancel the RF signal at each of the differential outputs. This differential approach enables high isolation limited only by device matching, which may be calibrated, unlike conventional series switches that are limited by device parasitics. This differential approach also has no inherent high frequency isolation degradation, preserves the DC operating point for operation at high switching speeds, and enables extremely small size integration within the amplifier cascode configuration.

Figure 2:
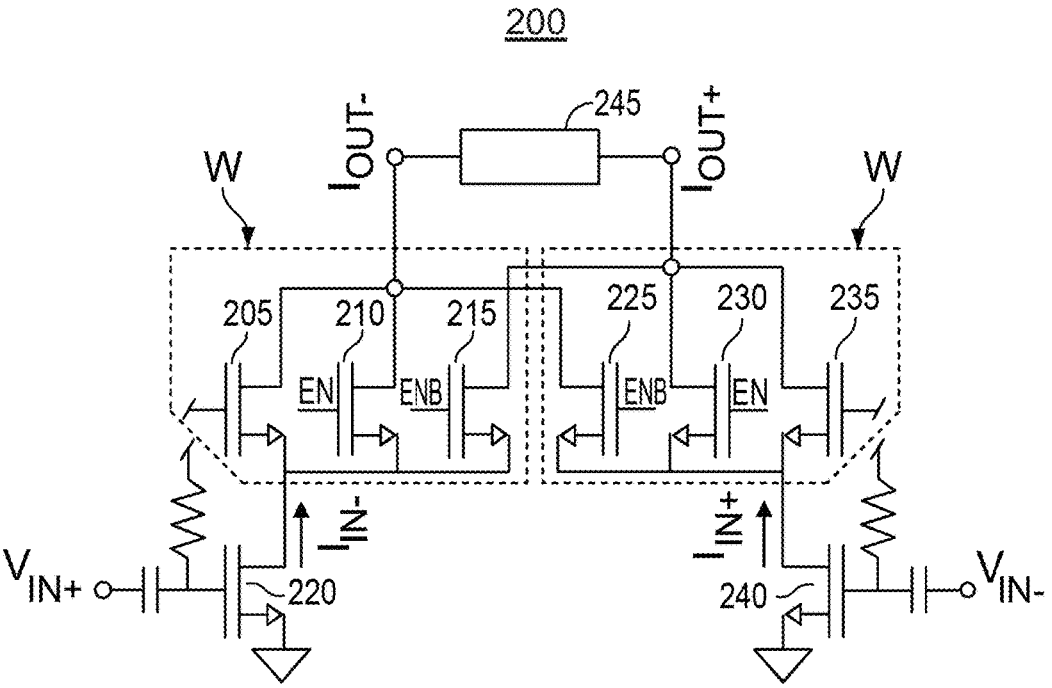
FIG. 2 illustrates a pseudo-differential switching amplifier in accordance with one or more embodiments of the present invention.

An exemplary pseudo-differential switching amplifier 200 in accordance with at least one embodiment is illustrated in FIG. 2, while other embodiments employing alternative cascode amplifier configurations, including balun and true differential, are described below. In the embodiment illustrated in FIG. 2, the cascode device of width W is split into three parallel transistors 205, 210, 215, each having a width of W/2. The gate of a positive inverting input transistor 220 receives a positive input voltage $V_{IN+}$ from a positive input terminal, while the drain of the positive inverting input transistor 220 is coupled to the sources of the three parallel transistors 205, 210, 215. The differential switching amplifier 200 includes three additional parallel transistors 225, 230, 235, each again having a width of W/2. The gate of a negative inverting input transistor 240 receives a negative input voltage $V_{IN-}$ from a negative input terminal, while the drain of the negative inverting input transistor 240 is coupled to the sources of the three parallel transistors 225, 230, 235. The drains of the transistors 205, 210, 225 are coupled to the negative output terminal $I_{OUT-}$, while the drains of the transistors 215, 230, 235 are coupled to the positive output terminal $I_{OUT+}$. A differential load 245 is coupled between the positive output terminal $I_{OUT+}$ and the negative output terminal $I_{OUT-}$.

The pseudo-differential switching amplifier 200 operates as follows. In the ON state, the differential switching amplifier 200 receives positive and negative input voltages $V_{IN+}$ and $V_{IN-}$ via the gates of the positive and negative inverting input transistors 220, 240, respectively. The positive and negative inverting input transistors 220, 240 convert the positive and negative input voltages $V_{IN+}$ and $V_{IN-}$ into corresponding currents, but with the opposite polarity, i.e., they are inverted, to form $I_{IN-}$ (transistor 220) and $I_{IN+}$ (transistor 240). In the ON state, the transistors 210, 230, are enabled via a high EN signal (i.e., EN=cascode bias voltage) applied to their gates, and thus are termed the enabled cascode transistors. As illustrated in FIG. 2, the transistors 205, 235 are always on as their gates are held high (i.e., cascode bias voltage), and thus are termed the always on cascode transistors. Thus, while in the ON state, half of the current $I_{IN-}$ passes through each of the enabled cascode transistor 210 and the always on cascode transistor 205, and on to negative output terminal $I_{OUT-}$, where the currents add as they have the same polarity. In like manner, half of the current $I_{IN+}$ passes through each of the enabled cascode transistor 230 and the always on cascode transistor 235, and on to positive output terminal $I_{OUT+}$, where the currents again add as they have the same polarity. The transistors 215, 225, which have the bar (or opposite) of the EN signal, i.e., the ENB signal, applied to their gates, will be disabled as the ENB signal will be low (i.e., ENB=VSS) when the differential switching amplifier 200 is in the ON state. Therefore, no current will flow through transistors 215, 220. Because the transistors 215, 225 receive the bar of the EN signal, transistors 215, 225 are termed the bar enabled cascode transistors. In the ON state, the differential switching amplifier 200 operates as a traditional differential switching amplifier with cascode. In the ON state, there is no gain loss compared to an amplifier without the added cascode transistors that are disabled.

In the OFF state, the transistors 210, 230, are disabled via a low EN signal (i.e., EN=VSS) applied to their gates, while the transistors 215, 225 are enabled due to the high ENB signal (i.e., ENB=cascode bias voltage) applied to their gates. Thus, while in the OFF state, half of the current $I_{IN-}$ passes through the enabled cascode transistor 215 and on to the positive output terminal $I_{OUT+}$, while the other half of the current $I_{IN-}$ passes through the always on cascode transistor 205 and on to the negative output terminal $I_{OUT-}$. In like manner, half of the current $I_{IN+}$ passes through the enabled cascode transistor 225 and on to the negative output terminal $I_{OUT-}$, while the other half of the current $I_{IN+}$ passes through the always on cascode transistor 235 and on to the positive output terminal $I_{OUT+}$. Because the positive output terminal $I_{OUT+}$ receives half of the current $I_{IN+}$ and half of the current $I_{IN-}$, no net current flows as the two currents are equal in magnitude, but opposite in polarity. In like manner, because the negative output terminal $I_{OUT-}$ receives half of the current $I_{IN+}$ and half of the current $I_{IN-}$, no net current flows as the two currents are again equal in magnitude, but opposite in polarity. The transistors 210, 230, which have the EN signal applied to their gates, will be disabled as the EN signal will be low when the differential switching amplifier 200 is in the OFF state. Therefore, no current will flow through transistors 210, 230. In the OFF state, the DC bias point is maintained from the ON state at all circuit nodes. This enables fast switching operation with no changes seen by downstream amplifier blocks. Overall isolation is thus set by differential matching.

Figures 3, 4:
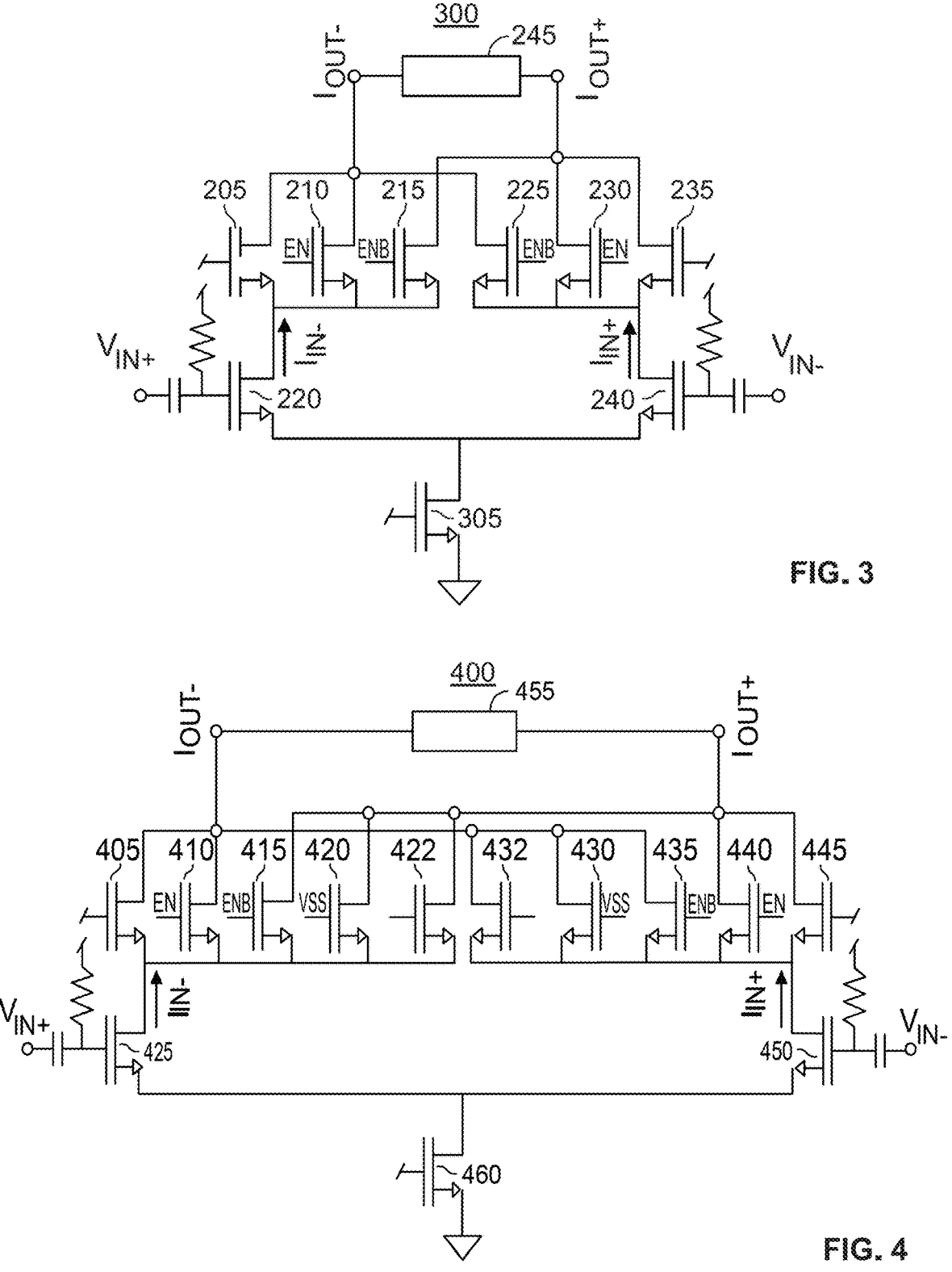
FIG. 3 illustrates a differential switching amplifier in accordance with one or more embodiments of the present invention.
FIG. 4 illustrates a differential switching amplifier in accordance with one or more embodiments of the present invention.

A true differential switching amplifier 300 in accordance with at least one embodiment is illustrated in FIG. 3. The differential switching amplifier 300 is much like the pseudo-differential switching amplifier 200, but the positive inverting input transistor 220 and the negative inverting input transistor 240 share a current source transistor 305 to VSS. The current source transistor 305 rejects common mode signals due to the high impedance of the current source transistor 305 if the differential input signal (i.e., $V_{IN+}$ and $V_{IN-}$) is actually the same polarity. In other embodiments, the current source transistor 305 may be replaced by another high impedance element, for example, an inductor, an LC tank circuit, or a resistor.

A second true differential switching amplifier 400 in accordance with at least one embodiment is illustrated in FIG. 4. In the differential switching amplifier 400, the cascode device of width W is split into four parallel transistors 405, 410, 415, 420, each having a width of W/2. The gate of a positive inverting input transistor 425 receives a positive input voltage $V_{IN+}$ from a positive input terminal, while the drain of the positive inverting input transistor 425 is coupled to the sources of the four parallel transistors 405, 410, 415, 420. The differential switching amplifier 400 includes four additional parallel transistors 430, 435, 440, 445, each again having a width of W/2. The gate of a negative inverting input transistor 450 receives a negative input voltage $V_{IN-}$ from a negative input terminal, while the drain of the negative inverting input transistor 450 is coupled to the sources of the four parallel transistors 430, 435, 440, 445. The drains of the transistors 405, 410, 430, 435 are coupled to the negative output terminal $I_{OUT-}$, while the drains of the transistors 415, 420, 440, 445 are coupled to the positive output terminal $I_{OUT+}$. A differential load 455 is coupled across the positive output terminal $I_{OUT+}$ and the negative output terminal $I_{OUT-}$. Further, the positive inverting input transistor 425 and the negative inverting input transistor 450 share a current source transistor 460 to VSS. The current source transistor 460 again rejects common mode signals. In other embodiments, the current source transistor 460 may be replaced by another high impedance element, for example, an inductor, an LC tank circuit, or a resistor. While differential switching amplifier 400 is a true differential switching amplifier due to the current source transistor 460, the current source transistor 460 may be deleted, resulting in a pseudo-differential switching amplifier, similar to pseudo-differential switching amplifier 200.

The differential switching amplifier 400 operates as follows. In the ON state, the differential switching amplifier 400 receives positive and negative input voltages $V_{IN+}$ and $V_{IN-}$ via the gates of the positive and negative inverting input transistors 425, 450, respectively. The positive and negative inverting input transistors 425, 450 convert the positive and negative input voltages $V_{IN+}$ and $V_{IN-}$ into corresponding currents, but with the opposite polarity, i.e., they are inverted, to form $I_{IN-}$ (transistor 425) and $I_{IN+}$ (transistor 450). In the ON state, the transistors 410, 440, are enabled via a high EN signal applied to their gates. As illustrated in FIG. 4, the transistors 405, 445 are always on as their gates are held high. Thus, while in the ON state, half of the current $I_{IN-}$ passes through each of the enabled cascode transistor 410 and the always on cascode transistor 405, and on to negative output terminal $I_{OUT-}$, where the currents add as they have the same polarity. In like manner, half of the current $I_{IN+}$ passes through each of the enabled cascode transistor 440 and the always on cascode transistor 445, and on to positive output terminal $I_{OUT+}$, where the currents again add as they have the same polarity. The transistors 415, 435, which have the opposite of EN signal, i.e., the ENB signal, applied to their gates, will be disabled as the ENB signal will be low when the differential switching amplifier 400 is in the ON state. As illustrated in FIG. 4, the transistors 420, 430 are always off as their gates are held low, and thus are termed the always off cascode transistors. Therefore, no current will flow through transistors 415, 420, 430, 435. In the ON state, the differential switching amplifier 400 operates as a traditional differential switching amplifier with cascode. In the ON state, there is no gain loss compared to an amplifier without the added cascode transistors that are disabled.

In the OFF state, the transistors 410, 440, are disabled via a low EN signal applied to their gates, while the transistors 415, 435 are enabled due to the high ENB signal applied to their gates. Thus, while in the OFF state, half of the current $I_{IN-}$ passes through the enabled cascode transistor 415 and on to the positive output terminal $I_{OUT+}$, while the other half of the current $I_{IN-}$ passes through the always on cascode transistor 405 and on to the negative output terminal $I_{OUT-}$. In like manner, half of the current $I_{IN+}$ passes through the enabled cascode transistor 435 and on to the negative output terminal $I_{OUT-}$, while the other half of the current $I_{IN+}$ passes through the always on cascode transistor 445 and on to the positive output terminal $I_{OUT+}$. Because the positive output terminal $I_{OUT+}$ receives half of the current $I_{IN+}$ and half of the current $I_{IN-}$, no net current flows as the two currents are equal in magnitude, but opposite in polarity. In like manner, because the negative output terminal $I_{OUT-}$ receives half of the current $I_{IN+}$ and half of the current $I_{IN-}$, no net current flows as the two currents are again equal in magnitude, but opposite in polarity. The transistors 410, 440, which have the EN signal applied to their gates, will be disabled as the EN signal will be low when the differential switching amplifier 400 is in the OFF state. Therefore, no current will flow through transistors 410, 440. In the OFF state, the DC bias point is maintained from the ON state at all circuit nodes. This enables fast switching operation with no changes seen by downstream amplifier blocks. Overall isolation is thus set by differential matching.

The always off transistors 420, 430 are included for symmetry in the cancellation operation, which provides the differential switching amplifier 400 with some benefits over the six cascode transistor designs of the pseudo-differential switching amplifier 200 and the differential switching amplifier 300. For example, in the ON and OFF states, power consumption in the differential switching amplifier 400 is identical, thus no added power consumption is consumed by this embodiment, in the same way as the prior art series RF switch approach. Further, and unlike the prior art series RF switch configuration, the only high frequency leakage path for the differential switching amplifier 400 is through the $C_{ds}$ of the cascode transistors 405, 410, 415, 420, 430, 435, 440, 445. However, by including the always off transistors 420, 430, the capacitive leakage is symmetric between both differential cancellation paths, i.e., from the drains of the positive and negative inverting input transistors 425, 450 to the positive and negative output terminals $I_{OUT+}$, $I_{OUT-}$, thereby making cancellation constant across frequency. A simulation with real devices including no mismatch confirmed this frequency independent cancellation, showing infinite isolation across the 0.2-60 GHz range. The isolation achieved is ultimately limited by mismatch in the differential switching amplifier 400 and its cascode transistors 405, 410, 415, 420, 430, 435, 440, 445.

Figure 5:
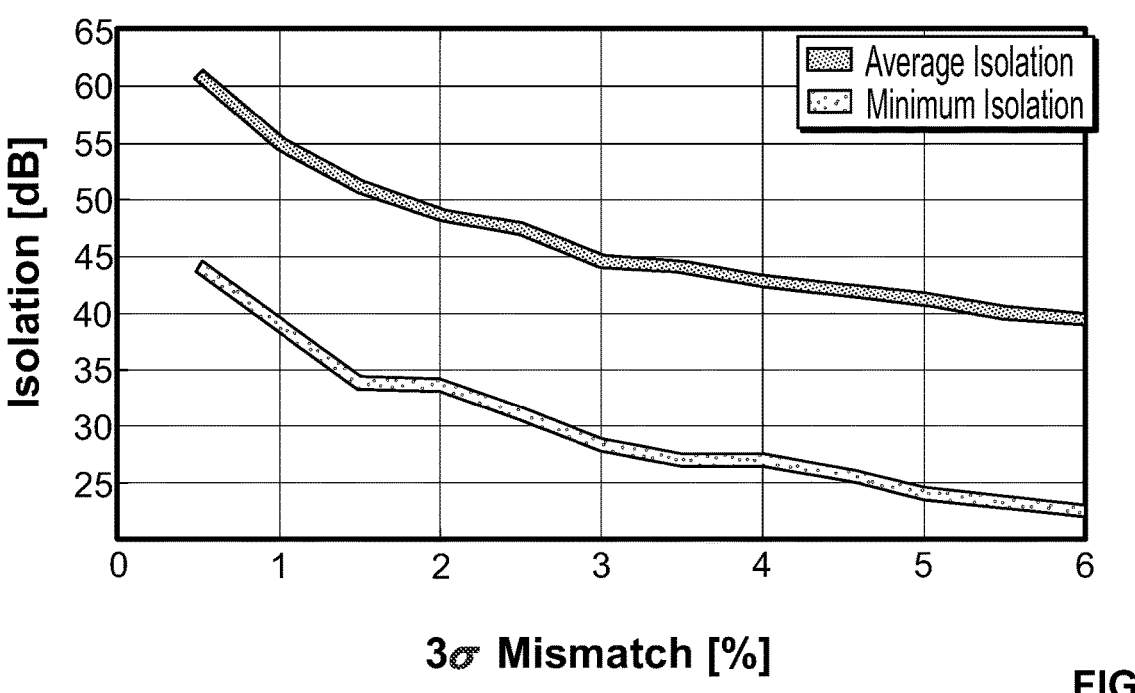
FIG. 5 illustrates the simulated average and worst case isolation performance of a differential switching amplifier in accordance with one or more embodiments of the present invention as a function of device mismatch for the cascode transistors.

FIG. 5 illustrates the average and worst case (3σ) isolation performance of the differential switching amplifier 400 as a function of device mismatch for cascode transistors 405, 410, 415, 420, 430, 435, 440, 445 using 1000 Monte Carlo simulation points. Since the isolation can be made flat across frequency and is limited by device mismatch, isolation may be further enhanced by calibrating the differential mismatch through a pair of additional, smaller, calibrating cascode transistors 422, 432, each placed in parallel to a corresponding one of the always off transistors 420, 430 to adjust the cancellation current strengths to each differential output from each differential input. Such an approach would still rely on differential symmetry in following circuits to cancel gain imbalance from the differential common source devices at each differential output.

For complete isolation calibration, both the cascode calibration described, as well as calibration of the transconductance of the positive and negative inverting input transistors 425, 450 would enable ideal cancellation at each differential output. Such calibration could be completed by adjusting the device bias points or by having parallel transistors (not illustrated) to the positive and negative inverting input transistors 425, 450, which could be enabled/disabled by a switch at their source nodes. Calibration to improve isolation is not possible using the prior art series switch approach as the isolation is limited by device parasitics.

Advantageously, the differential switching amplifiers 200, 300, 400 have no change in DC bias voltage at the source or drain nodes of the cascode switch, therefore saving significant area by removing the DC blocking capacitor required at the input side of the prior art series switch. Removing this DC blocking capacitor also enables fast switch transition times for the differential switching amplifiers 200, 300, 400. Since the differential switching amplifiers 200, 300, 400 can be implemented in CMOS, the differential switching amplifiers 200, 300, 400 can be directly implemented on-chip with other receiver and transmitter circuits, can be controlled with standard CMOS control voltages, and can be implemented with extremely small area overhead.

Figure 6:
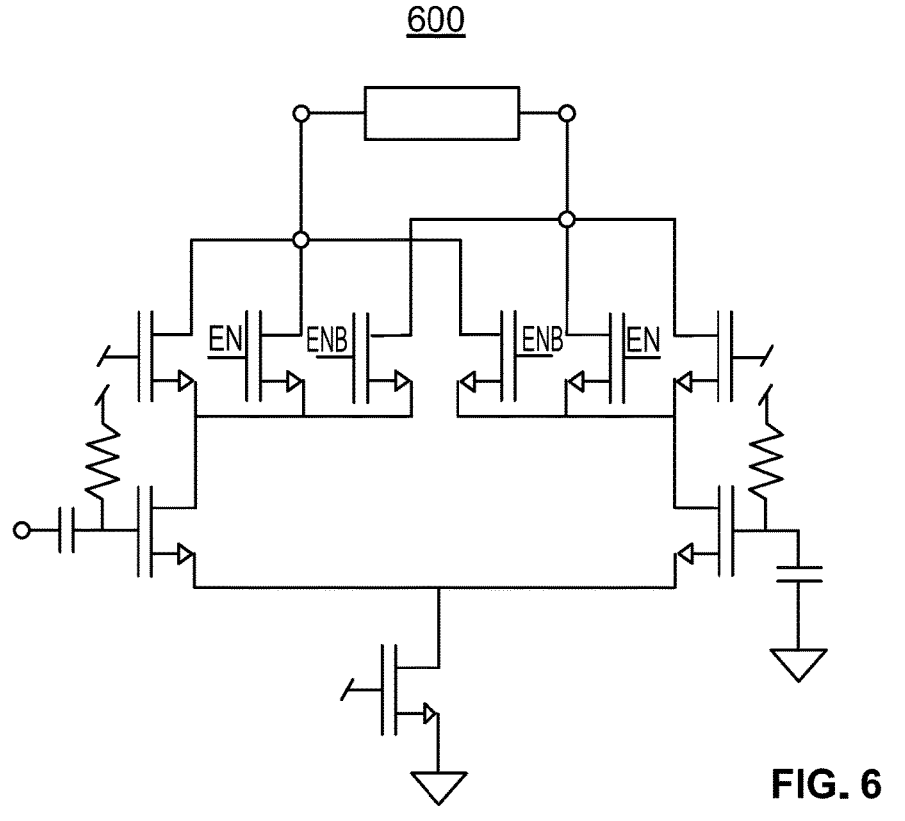
FIG. 6 illustrates a balun switching amplifier in accordance with one or more embodiments of the present invention.

A fourth embodiment was implemented, in part, within the high intermediate frequency (IF) portion of an RF receiver. This embodiment employed a single-to-differential balun amplifier 600, as illustrated in FIG. 6, targeting operation from 0.5-1 GHz. The primary difference between the balun amplifier 600 and the differential switching amplifier 300 is that the negative input terminal is capacitively coupled to VSS. The intended application required modest isolation in each balun amplifier 600, which was achieved with no calibration. However, common centroid layout techniques were used in the design to achieve good matching performance. Since the implemented balun amplifier 600 was targeting frequencies below 1 GHz, the additional always off transistors (FIG. 4, elements 420, 430) were not included for area savings as simulation showed capacitive symmetry effects on isolation would not reduce performance until approximately 1.5 GHz. Both calibration and the addition of the always off transistors 420, 430 may be included as described above for increased bandwidth and switch isolation performance.

The single-to-differential balun amplifier 600 illustrated in FIG. 6 was implemented in a 180 nm CMOS process in the IF section of an RF receiver. The resultant active area of the balun amplifier 600 was 0.0054 mm² and the cascode switching circuitry consumed only 0.0006 mm² area. As will be appreciated by one of skill in the art, the area overhead of the balun amplifier 600 is even smaller as much of the active area would already have been consumed by the cascode devices in the same amplifier without the proposed switch technique. The cascode switching technique adds no additional power consumption to the balun amplifier 600, similar to using the prior art series switch technique, and the balun amplifier 600 consumes 2.4 mW from a 1.8V supply.

Figure 7:
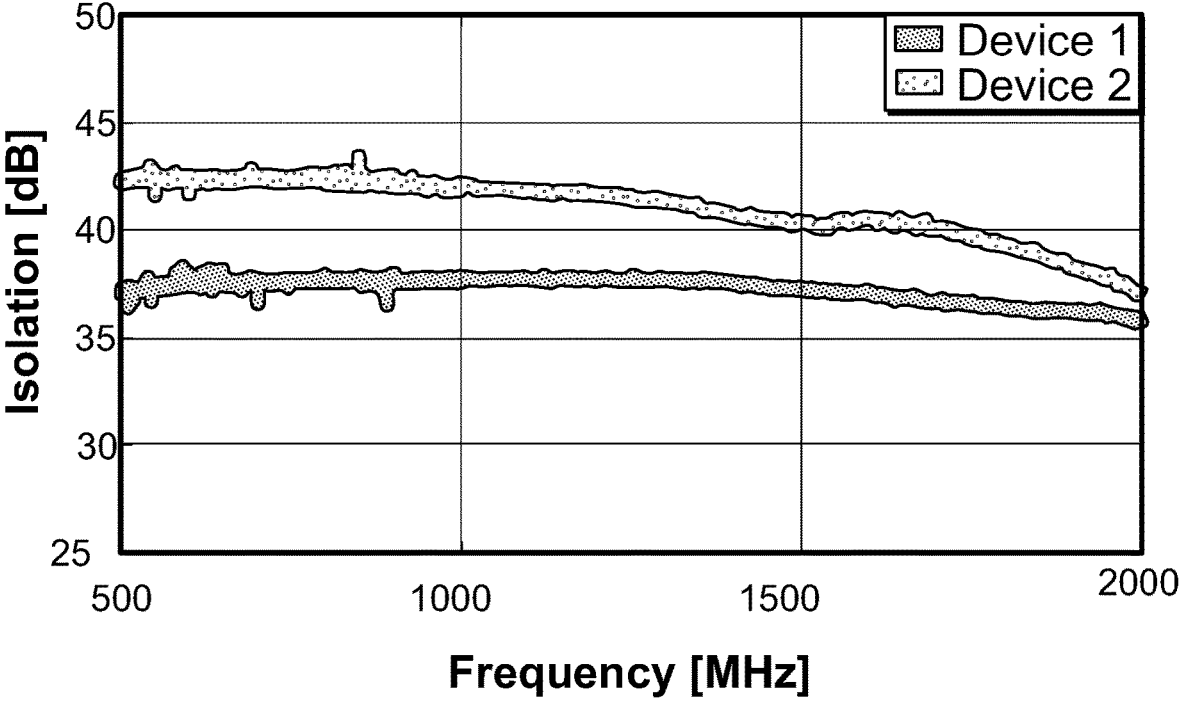
FIG. 7 illustrates the measured isolation performance of two differential switching amplifiers in accordance with one or more embodiments of the present invention across the 0.5-2 GHz frequency range.

Isolation performance of the single-to-differential balun amplifier 600 was measured for two devices across the 0.5-2 GHz frequency range, with the results illustrated in FIG. 7. Flat isolation of greater than 36 dB was achieved across the 0.5-2 GHz frequency range, while isolation begins to roll off around 1.5 GHZ, as was expected based on the simulation noted above. Employing additional cascode transistors for capacitive symmetry, for example, the always off transistors 420, 430 in FIG. 4, permits higher frequency operation. While only two balun amplifiers were measured, uncalibrated performance is expected to follow that illustrated in FIG. 5 for a larger sample size, while calibration, as described above, may be included for increased performance. It should be noted that the single-to-differential balun approach of the balun amplifier 600 is expected to yield poorer isolation than that possible with the full differential approach of the differential switching amplifiers 200, 300, 400.

The measurement results of the single-to-differential balun amplifier 600 implementation are compared to prior art RF switching techniques in Table 1. See, J. Hug et al., "A 100 W UHF to S-band RF Switch in the Super-Lattice Castellated Field Effect Transistor (SLCFET) 3S Process," 2020 IEEE Radio Frequency Integrated Circuits Symposium, pp. 71-74 (2020) (Hug); MTT (2013): M. Parlak and J. Buckwalter, "A Passive I/Q Millimeter-Wave Mixer and Switch in 45-nm CMOS SOI," IEEE Transactions on Microwave Theory and Techniques, vol. 61, no. 3, pp. 1131-1139 (2013) (Parlak); the contents of each of which are incorporated herein by reference. The example balun amplifier 600 shows similar isolation as the prior art series switches with significantly lower active area. The balun amplifier 600 also yields no added insertion loss, DC preserving operation, requires only a CMOS compatible control voltage, and, while not implemented in this particular balun amplifier 600, can be calibrated for further increased isolation performance. While generally described here at low GHz operating frequencies, various embodiments may be employed at much higher RF frequencies using the techniques described above to achieve high isolation at high frequency using calibration and capacitive device symmetry.

TABLE 1

| Performance Summary and Comparison to Prior Art. | | | |
|---|---|---|---|
| | Embodiment of Present Invention | Hug | Parlak |
| Architecture | Differential Cancellation | Series Switch | Series Switch |
| Frequency | 0.5-2.0 GHz | 0.4-5.5 GHz | 1-60 GHz |
| Isolation | 36-43 dB[1] | 40-70 dB | 23-50 dB |
| Insertion Loss | None | 0.3 dB | 0.7-2.5 dB |
| Can Calibrate Isolation? | Y[1] | N | N |
| DC Preserving? | Y | N | N |
| Control Voltage | 1.8 V | −8 V | 1 V |
| Technology | 180 nm CMOS | GaN SLCFET | 45 nm SOI CMOS |
| Active Area | 0.0006 mm$^2$ | 3.38 mm$^2$ | 0.04 mm$^2$ |

[1]Differential cancellation enables calibration but was not implemented in the measured device.

Various embodiments of the present invention may be employed in a number of applications. For example, certain embodiments may be employed in pulse radar systems, high-speed communication systems, tagging/tracking/locating devices, as part of RF IC IP or microelectronics IP, and long distance communication systems.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A differential switching amplifier comprising:
positive and negative inverting input transistors adapted to receive corresponding positive and negative input voltages and to convert the corresponding positive and negative input voltages into respective negative and positive input currents;
positive and negative output terminals adapted to output corresponding positive and negative output currents;
a pair of always on cascode transistors, each of the pair of always on cascode transistors having a width of W/2, a first of the pair of always on cascode transistors adapted to couple half of the negative input current to the negative output terminal, a second of the pair of always on cascode transistors adapted to couple half of the positive input current to the positive output terminal;
a pair of enabled cascode transistors adapted to receive an enable gate signal (EN), each of the pair of enabled cascode transistors having a width of W/2, a first of the pair of enabled cascode transistors adapted to couple half of the negative input current to the negative output terminal when EN is high and to couple no current to the negative output terminal when EN is low, a second of the pair of enabled cascode transistors adapted to couple half of the positive input current to the positive output terminal when EN is high and to couple no current to the positive output terminal when EN is low;
a pair of bar enabled cascode transistors adapted to receive a bar enable gate signal (ENB), wherein ENB is a logical opposite of EN, each of the pair of bar enabled cascode transistors having a width of W/2, a first of the pair of bar enabled cascode transistors adapted to couple half of the negative input current to the positive output terminal when ENB is high and to couple no current to the positive output terminal when ENB is low, a second of the pair of bar enabled cascode transistors adapted to couple half of the positive input current to the negative output terminal when ENB is high and to couple no current to the negative output terminal when ENB is low; and
a pair of always off cascode transistors, each of the pair of always off cascode transistors having a width of W/2, a first of the pair of always off cascode transistors coupled between the positive inverting input transistor and the negative output terminal, a second of the pair of always off cascode transistors coupled between the negative inverting input transistor and the positive output terminal.

2. The differential switching amplifier of claim 1, further comprising a current source device, the current source device coupled to corresponding sources of the positive and negative inverting input transistors, the current source device adapted to reject common mode signals.

3. The differential switching amplifier of claim 2, wherein the current source device is one of a transistor, an inductor, an LC tank circuit, or a resistor.

4. The differential switching amplifier of claim 1, further comprising a pair of calibrating cascode transistors, a first of the pair of calibrating cascode transistors coupled between the positive inverting input transistor and the negative output terminal, a second of the pair of calibrating cascode transistors coupled between the negative inverting input transistor and the positive output terminal, the pair of calibrating cascode transistors adapted to cancel gain imbalance between the positive and negative output terminals.

5. The differential switching amplifier of claim 1, wherein the positive and negative input voltages correspond to a balanced input voltage.

6. The differential switching amplifier of claim 1, wherein the positive input voltage corresponds to an unbalanced input voltage and the negative input voltage corresponds to ground.

7. An RF system comprising:
an antenna adapted to transmit and receive RF signals;
a baseband and processing element adapted to process baseband signals; and
receive and transmit differential switching amplifiers, the receive differential switching amplifier adapted to receive an RF signal from the antenna and to output an amplified/switched signal to the baseband and processing element, the transmit differential switching amplifier adapted to receive an RF signal from the baseband and processing element and to output an amplified/switched signal to the antenna, each of the receive and transmit differential switching amplifiers including:

positive and negative inverting input transistors adapted to receive corresponding positive and negative input voltages corresponding to an RF signal and to convert the corresponding positive and negative input voltages into respective negative and positive input currents;

positive and negative output terminals adapted to output corresponding positive and negative output currents;

a pair of always on cascode transistors, each of the pair of always on cascode transistors having a width of W/2, a first of the pair of always on cascode transistors adapted to couple half of the negative input current to the negative output terminal, a second of the pair of always on cascode transistors adapted to couple half of the positive input current to the positive output terminal;

a pair of enabled cascode transistors adapted to receive an enable gate signal (EN), each of the pair of enabled cascode transistors having a width of W/2, a first of the pair of enabled cascode transistors adapted to couple half of the negative input current to the negative output terminal when EN is high and to couple no current to the negative output terminal when EN is low, a second of the pair of enabled cascode transistors adapted to couple half of the positive input current to the positive output terminal when EN is high and to couple no current to the positive output terminal when EN is low; and a pair of bar enabled cascode transistors adapted to receive a bar enable gate signal (ENB), wherein ENB is a logical opposite of EN, each of the pair of bar enabled cascode transistors having a width of W/2, a first of the pair of bar enabled cascode transistors adapted to couple half of the negative input current to the positive output terminal when ENB is high and to couple no current to the positive output terminal when ENB is low, a second of the pair of bar enabled cascode transistors adapted to couple half of the positive input current to the negative output terminal when ENB is high and to couple no current to the negative output terminal when ENB is low;

wherein each of the receive and transmit differential switching amplifiers further includes a pair of always off cascode transistors, each of the pair of always off cascode transistors having a width of W/2, a first of the pair of always off cascode transistors coupled between the positive inverting input transistor and the negative output terminal, a second of the pair of always off cascode transistors coupled between the negative inverting input transistor and the positive output terminal.

8. The RF system of claim 7, wherein each of the receive and transmit differential switching amplifiers further includes a current source device, the current source device coupled to corresponding sources of the positive and negative inverting input transistors, the current source device adapted to reject common mode signals.

9. The RF system of claim 8, wherein the current source device is one of a transistor, an inductor, an LC tank circuit, or a resistor.

10. The RF system of claim 7, wherein each of the receive and transmit differential switching amplifiers further includes a pair of calibrating cascode transistors, a first of the pair of calibrating cascode transistors coupled between the positive inverting input transistor and the negative output terminal, a second of the pair of calibrating cascode transistors coupled between the negative inverting input transistor and the positive output terminal, the pair of calibrating cascode transistors adapted to cancel gain imbalance between the positive and negative output terminals.

11. The RF system of claim 7, wherein the positive and negative input voltages correspond to a balanced input RF signal.

12. The RF system of claim 7, wherein the positive input voltage corresponds to an unbalanced input RF signal and the negative input voltage corresponds to ground.

13. The RF system of claim 7, further comprising second receive and transmit differential switching amplifiers, the second receive differential switching amplifier adapted to receive the amplified/switched signal from the receive differential switching amplifier and to output a further amplified/switched signal to the baseband and processing element, the second transmit differential switching amplifier adapted to receive the amplified/switched signal from the transmit differential switching amplifier and to output a further amplified/switched signal to the antenna.

14. The RF system of claim 13, wherein each of the second receive and transmit differential switching amplifiers comprises:

second positive and negative inverting input transistors adapted to receive corresponding second positive and negative input voltages corresponding to the RF signal and to convert the corresponding second positive and negative input voltages into respective second negative and positive input currents;

second positive and negative output terminals adapted to output corresponding second positive and negative output currents;

a second pair of always on cascode transistors, each of the second pair of always on cascode transistors having a width of W/2, a first of the second pair of always on cascode transistors adapted to couple half of the second negative input current to the second negative output terminal, a second of the second pair of always on cascode transistors adapted to couple half of the second positive input current to the second positive output terminal;

a second pair of enabled cascode transistors adapted to receive a second enable gate signal (EN), each of the second pair of enabled cascode transistors having a width of W/2, a first of the second pair of enabled cascode transistors adapted to couple half of the second negative input current to the second negative output terminal when the second EN is high and to couple no current to the second negative output terminal when the second EN is low, a second of the second pair of enabled cascode transistors adapted to couple half of the second positive input current to the second positive output terminal when the second EN is high and to couple no current to the second positive output terminal when the second EN is low; and a second pair of bar enabled cascode transistors adapted to receive a second bar enable gate signal (ENB), wherein the second ENB is a logical opposite of the second EN, each of the second pair of bar enabled cascode transistors having a width of W/2, a first of the second pair of bar enabled cascode transistors adapted to couple half of the second negative input current to the second positive output terminal when the second ENB is high and to couple no current to the second positive output terminal when the second ENB is low, a second of the second pair of bar enabled cascode transistors adapted to couple half of the second positive input current to the second negative output terminal when the second ENB is high and to couple no current to the second negative output terminal when the second ENB is low.

* * * * *